United States Patent [19]

Poliquin et al.

[11] Patent Number: 5,558,909
[45] Date of Patent: Sep. 24, 1996

[54] APPARATUS AND METHOD FOR VACUUM-METALLIZING ARTICLES WITH SIGNIFICANT DEPOSITION ONTO THREE-DIMENSIONAL SURFACES

[75] Inventors: Alfred T. Poliquin; Paul Hagenow, both of Dover, N.H.

[73] Assignee: Textron Automotive Interiors, Inc., Troy, Mich.

[21] Appl. No.: 587,939

[22] Filed: Jan. 17, 1996

[51] Int. Cl.$^6$ ............................................... C23C 14/00
[52] U.S. Cl. .................. 427/251; 118/730; 204/192.15; 204/298.27
[58] Field of Search ..................... 118/730; 204/298.27, 204/192.15; 427/251

[56] References Cited

U.S. PATENT DOCUMENTS

| | | | |
|---|---|---|---|
| 2,992,125 | 7/1961 | Fustier | 117/7 |
| 2,993,806 | 7/1961 | Fisher et al. | 117/71 |
| 3,118,781 | 1/1964 | Downing | 117/33.3 |
| 3,914,472 | 10/1975 | Nakanishi et al. | 427/250 |
| 4,010,710 | 3/1977 | Williams | 118/49 |
| 4,034,704 | 7/1977 | Wössner et al. | 118/49 |
| 4,101,698 | 7/1978 | Dunning et al. | 428/31 |
| 4,131,530 | 12/1978 | Blum et al. | 204/192 |
| 4,211,822 | 7/1980 | Kurfman, et al. | 428/412 |
| 4,215,170 | 7/1980 | Vilaprinyo Oliva | 428/328 |
| 4,431,711 | 2/1984 | Eisfeller | 428/31 |
| 5,074,246 | 12/1991 | Gailliard et al. | 118/730 |
| 5,133,604 | 7/1992 | Moore et al. | 374/54 |
| 5,198,272 | 3/1993 | Eisfeller | 427/251 |
| 5,284,679 | 2/1994 | Eisfeller et al. | 427/240 |
| 5,290,625 | 3/1994 | Eisfeller et al. | 428/216 |

*Primary Examiner*—Richard Bueker
*Attorney, Agent, or Firm*—Reising, Ethington, Barnard & Perry

[57] ABSTRACT

A metallizing apparatus for vacuum-metallizing both recessed and non-recessed surfaces of relatively massive articles such as automotive wheels includes a vacuum chamber and a linear array of electron beam-type metal particle emitters. The emitter array is positioned in the chamber to thermally evaporate metal onto each article. A rack is supported within the chamber and rotates about a horizontal rack axis between two vertical end braces. Two or more identical articles are supported to rotate on the rack about respective second and third axes as the rack rotates about the horizontal rack axis. The articles both rotate around the rack axis and each simultaneously rotate around their respective second and third rotational axes while being held in the path of metal particles emanating from the emitters. The articles are mounted on the rack so that their respective second and third rotational axes are positioned at an angle to the rack axis. Adjustable pivot mechanisms allow an operator to vary these angles.

17 Claims, 2 Drawing Sheets

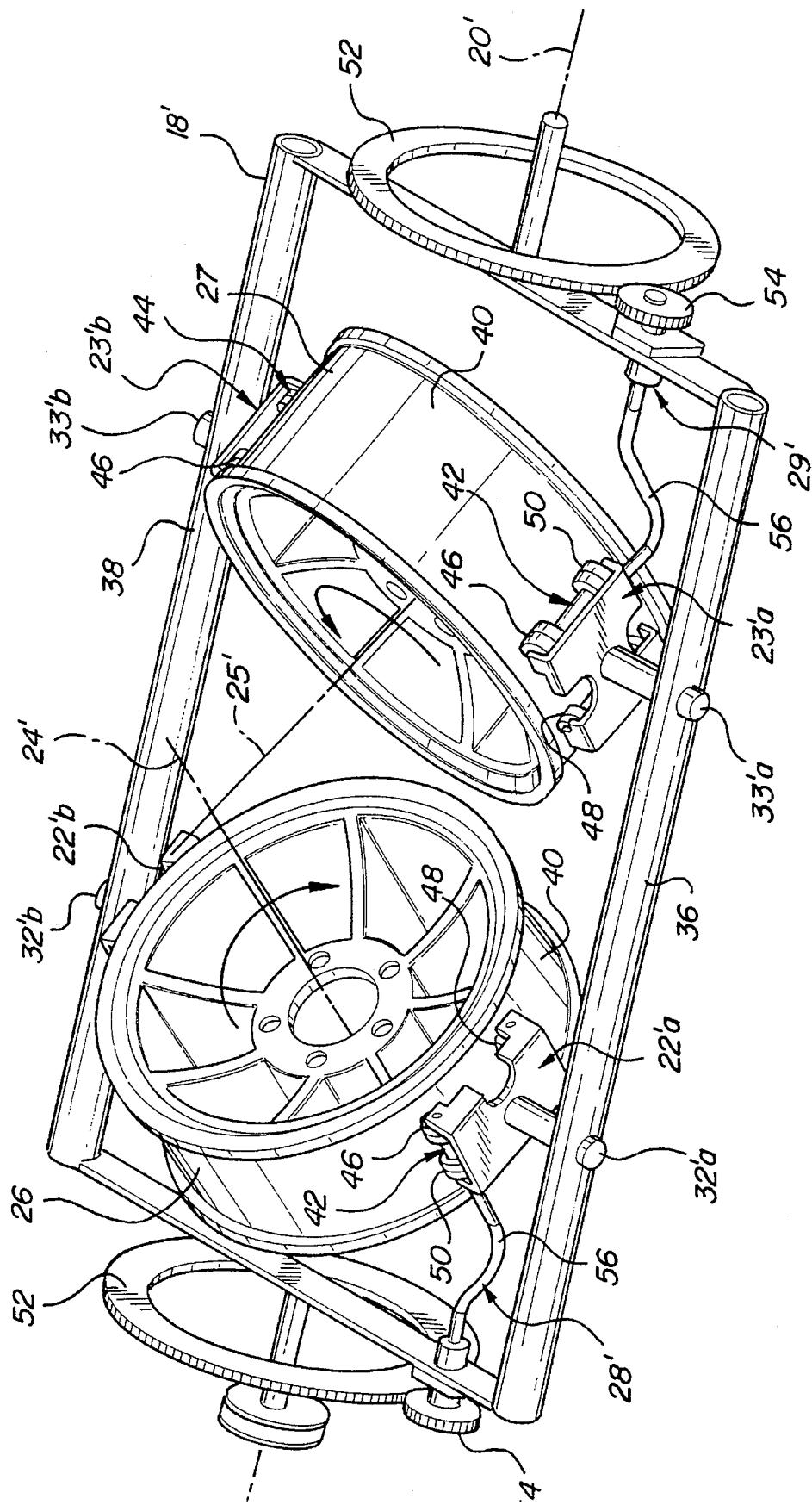

APPARATUS AND METHOD FOR VACUUM-METALLIZING ARTICLES WITH SIGNIFICANT DEPOSITION ONTO THREE-DIMENSIONAL SURFACES

TECHNICAL FIELD

This invention relates generally to vacuum metallizing and, more particularly, to vacuum metallizing both the recessed and non-recessed surfaces of a relatively massive article such as an automotive wheel.

BACKGROUND OF THE INVENTION

Vacuum metallizing of plastic and similar dielectric substrates has been practiced for some time and is disclosed, in various forms, in the following patents:

U.S. Pat. No. 2,992,125, Fustier
U.S. Pat. No. 2,993,806, Fisher
U.S. Pat. No. 3,118,781, Downing
U.S. Pat. No. 3,914,472, Nakanishi
U.S. Pat. No. 4,101,698, Dunning
U.S. Pat. No. 4,131,530, Blum
U.S. Pat. No. 4,211,822, Kaufman
U.S. Pat. No. 4,215,170, Oliva U.S. Pat. No. 4,431,711, issued Feb. 14, 1984 to Eisfeller and assigned to the assignee of this invention, discloses the "bright trim" process—an improved method of vacuum metallizing a dielectric substrate with indium and alloys of indium. The patent relates to an article of manufacture comprising organic dielectric bases or substrates having a smooth surface, such as a molded plastic. A macroscopically continuous-appearing very thin film or layer of indium and indium alloys is deposited on the smooth surface. The metal is in the form of minute specular electrically discrete rounded metal islands. There is a top coating over the metal film of an intimately adhered dielectric resin film encapsulating and protecting the metal particles, and binding them firmly to the substrate. The product is particularly useful in automotive applications, such as in automobile exterior trim components and wheels.

U.S. Pat. No. 5,290,625, issued Mar. 1, 1994 to Eisfeller and also assigned to the assignee of this invention, discloses a "bright trim" vacuum-metallized coating applied to an aluminum part. The coating is deposited over two layers of dielectric urethane resinous material that lay over a chromate conversion coating layer formed as a compound of the conductive base layer of aluminum.

During the "bright trim" vacuum metallizing process, a vacuum chamber encompasses the dielectric substrate to be coated along with metal particle emitters. The metal film may be deposited by sputtering, ion plating, induction heating, electron beam evaporation, thermal evaporation and like methods. An example of thermal metal evaporation from evaporator boats is disclosed in U.S. Pat. No. 5,133,604, issued to Moore et al., and assigned to the assignee of the subject invention.

In general, a plurality of metal particle emitters are mounted on a horizontal bus bar and connected in parallel or series to a power source. The emitters are connected horizontally below a rotational carousel or rack which supports the articles to be metallized. The rack rotates around a horizontal axis. The rack rotates during the evaporation process to allow the metal particles to adhere evenly to each article surface. The rack may include a plurality of reels which support the article to be metallized and rotate around an axis parallel to the horizontal rotational rack axis.

A problem with these vacuum metallization systems is that the metal particles will not deposit evenly on certain article surfaces that never or seldom fall within "line of sight" of the emitters. Examples of such "hard-to-reach" surfaces include cupped, concave, inset, indented and other types of recessed surfaces. These types of surfaces are commonly found in the interior contours between the hub and the rim of an automotive wheel. Such recessed surfaces are difficult to reach even where a metallization system employs a rotational carousel and reels that rotate on axes parallel to the carousel axis.

SUMMARY OF THE INVENTION

In accordance with this invention a method and apparatus are provided for vacuum-metallizing both recessed and non-recessed surfaces of a relatively massive article such as an automotive wheel. A metal particle emitter is supported within a vacuum chamber to thermally evaporate metal toward the article. A rack is supported for rotation within the chamber about a rack axis adjacent the emitter. A first mount assembly is connected to the rack and is adapted to removably hold and support the first article for rotation about a second axis extending at a first predetermined angle to the rack axis. The second axis is disposed at a predetermined angle from the rack axis to cause the first article to simultaneously rotate about the rack axis and the second axis thereby exposing the hard-to-reach recessed article surfaces to metal particle emissions from the emitter. This allows the emitter to deposit metal particles more evenly across the recessed and non-recessed article surfaces.

The invention further includes a first mount assembly and rack adapted to removably hold and rotatably support the first article in a position where the second axis and the rack axis each pass through the center of gravity of the first article.

The invention further includes a second mount assembly connected to the rack and adapted to removably hold and support a second article for rotation about a third axis. The third axis extends at a second predetermined angle to said rack axis.

The invention further includes pivot mechanisms disposed between the rack and each of the first and second mount assemblies. The pivot mechanisms allow an operator to vary the "predetermined" angle to an optimum value for each different article. The optimum angular value for a particular article is the value that will most completely expose the "hard-to-reach" surfaces of that particular article to the particle emitter.

Still another feature of the invention is the mounting of the emitters in a linear array disposed parallel to said rack axis.

BRIEF DESCRIPTION OF THE DRAWINGS

To better understand and appreciate the invention, refer to the following detailed description in connection with the accompanying drawings:

FIG. 3 is a perspective view of a second embodiment of the invention.

DETAILED DESCRIPTION OF THE PREFERRED EMBODIMENT

Figure 1:
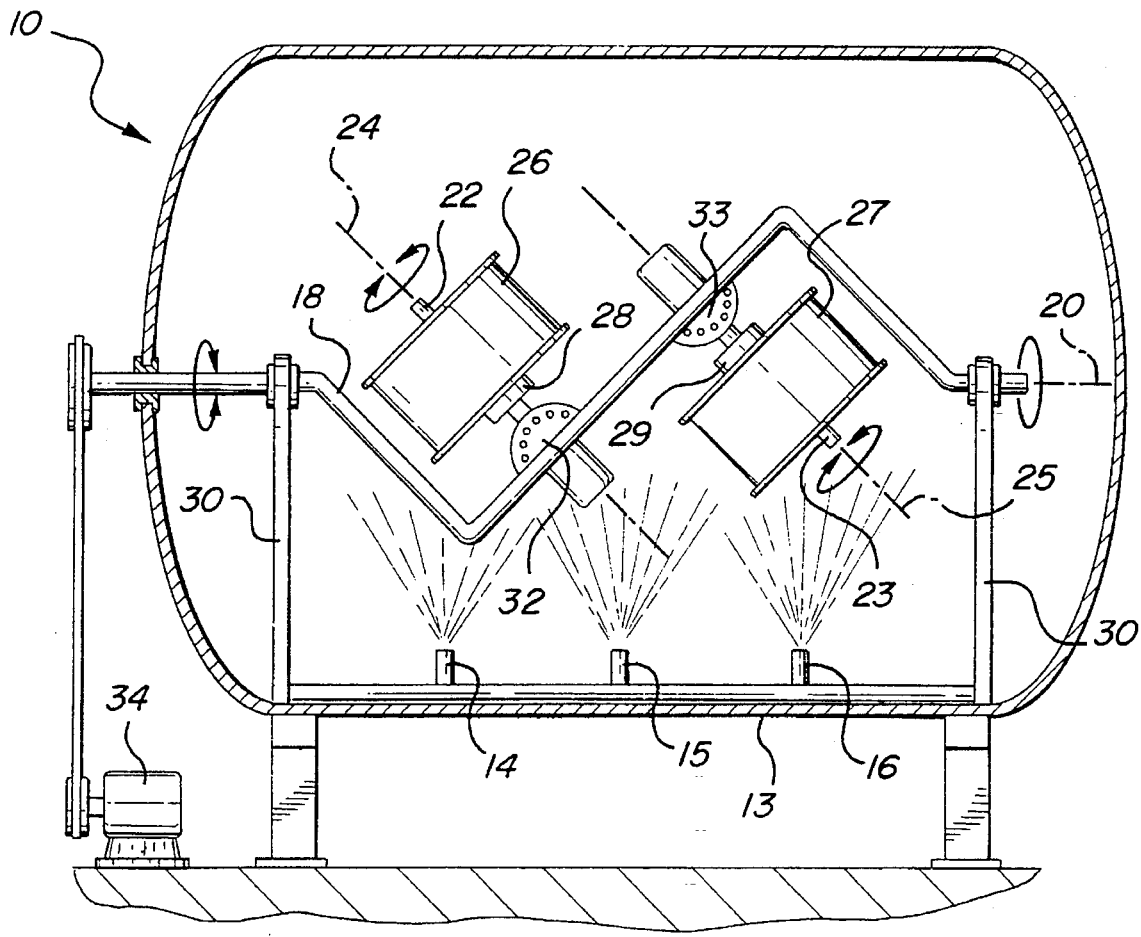
FIG. 1 is a partial cut-away front view of a first embodiment of the invention.
Figure 2:
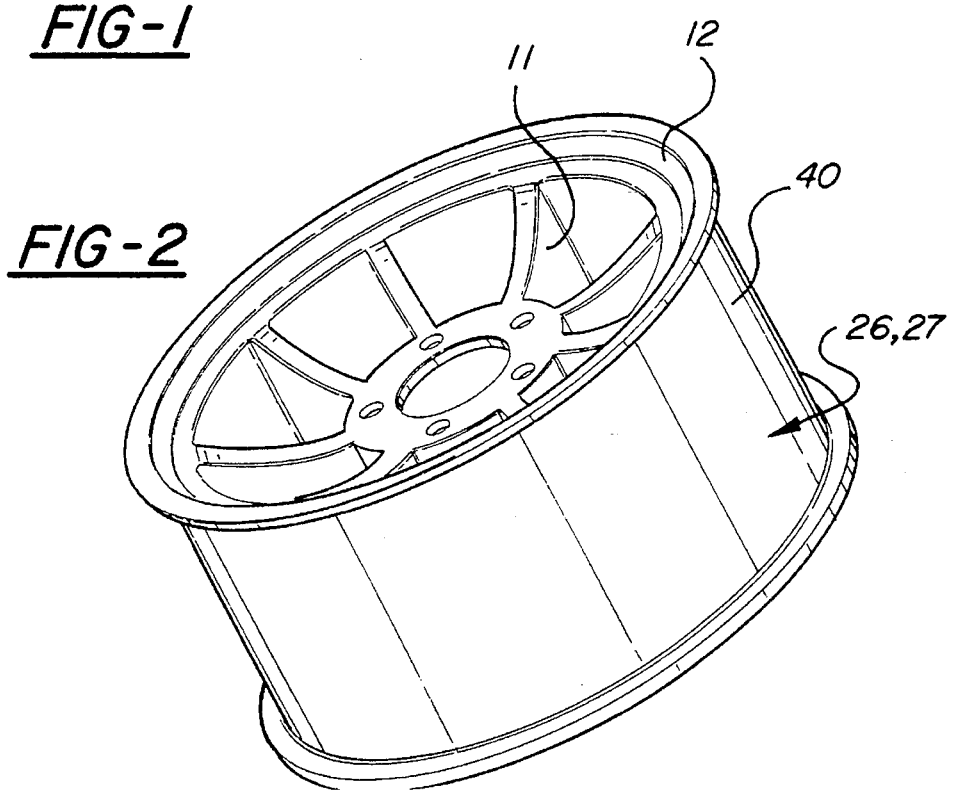
FIG. 2 is a perspective view of an automotive wheel.

An apparatus for vacuum-metallizing both recessed and non-recessed surfaces of a relatively massive article such as an automotive wheel is generally shown at 10 in FIG. 1. An automotive wheel of the type that may be mounted on the apparatus 10 is generally indicated at 26, 27 in FIG. 2.

As shown in FIG. 1, a first embodiment of the assembly 10 includes a vacuum chamber 13, first 14 second 15 and third 16 metal particle emitters and a rack 18 that rotates around a rack axis 20. A second embodiment of the rack 18 and elements supported on and adjacent the rack 18 is shown in FIG. 3. In FIG. 3, reference numerals including a prime (') symbol designate depictions of alternative configurations of elements common to the first embodiment. Unless indicated otherwise, where the following description refers to an element with a reference numeral having no prime symbol, we intend that description to apply equally to elements in FIG. 3 indicated by the same reference numeral with a prime symbol.

The first embodiment includes first and second mount assemblies in the form of first 22 and second 23 spindles. The spindles 22, 23 are supported on the rack 18 and rotate around respective second 24 and third 25 axes. The first spindle 22 holds a first article 26, such as an automotive wheel, and the second spindle 23 holds a second article 27 identical to the first 26. The rack 18 and first spindle 22, cause the first article 26 to rotate around both the rack axis 20 and the second 24 axis while holding the first article 26 directly in the path of metal particles emanating from the first 14 and second 15 emitters. The rack 18 and second spindle 23, cause the second article 27 to rotate around both the rack axis 20 and the third axis 25 while holding the second article 27 directly in the path of metal particles emanating from the second 14 and third 15 emitters. The rack 18 and spindles 22, 23 are configured so that both the rack axis 20 and the second axis 24 pass through the first article, and so that both the rack axis 20 and the third axis 25 pass through the second article. The second axis 24 and spindle 22 pass through the center of gravity of the first article 26 and the third axis 25 and second spindle 23 pass through the center of gravity of the second article 27.

The articles to be metallized 26, 27 each include an organic dielectric base or substrate material with a smooth surface suitable for vacuum metallization. Suitable substrate materials are set forth in U.S. Pat. No. 5,198,272 issued Mar. 30, 1993 to Eisfeller (the Eisfeller '272 patent) and U.S. Pat. No. 4,431,771 issued Feb. 14, 1984 to Eisfeller, both of which are incorporated herein by reference. A detailed disclosure of the vacuum metallizing process is also included in the Eisfeller '272 patent and is incorporated herein by reference.

The articles to be metallized 26, 27 may also comprise a metallic base material, such as aluminum, with layers of dielectric urethane resinous material suitable for vacuum metallization. A detailed disclosure of a vacuum metallizing process for aluminum articles is included in U.S. Pat. No. 5,320,869 to Eisfeller et al. and is incorporated herein by reference.

The vacuum chamber 13 includes a hinged door for allowing articles 26, 27 to be inserted and mounted inside the vacuum chamber 13.

The metal particle emitters 14, 15, 16 are supported in the chamber 13 in an evenly-spaced linear array 26 running parallel to the rack axis 20. The metal particle emitters 14, 15, 16 are preferably electron beam sources. Other acceptable methods of depositing the metal film include sputtering, ion plating, induction heating, electron beam evaporation, and thermal evaporation. To employ the thermal evaporation option, metal-evaporator boats may be used as emitters. The boats may be of the type set forth in U.S. Pat. No. 5,133,604 issued Jul. 28, 1992 to Moore et al. and incorporated herein by reference.

As shown in FIG. 1, emitters 14, 15, 16 are fastened, in a linear array, to an elongated member mounted beneath the rack 18.

The rack 18 is supported for rotation within the chamber 13 about a rack axis 20. The rack 18 is positioned to rotate the article 26 in the path of the vaporized metal that emanates from the first 14 and second 15 emitters and to rotate the article 27 in the path of vaporized metal emanating from the second 15 and third 16 emitters. The rack 18 rotates at 10–15 rpm. A pair of end braces 30 are fixed to the chamber 13 and support both ends of the rack 18 for rotation about the rack axis 20.

The spindles 22, 23 are rotatably connected to the rack 18 and are adapted to removably fasten and rotatably support the articles 26, 27 on the rack 18.

The first spindle 22 is supported for rotation about the second axis 24 and the second spindle 23 is supported for rotation about the third axis 25. First 28 and second 29 rotation drive units 28 cause the spindles 22, 23 to each rotate at no more than 10–15 rpm.

A drive motor 34 is located outside the vacuum chamber 13. A feed-through carries rotational driving force from the drive motor 34 to the rack 18 inside the chamber 13.

Each spindle 22, 23 extends from the rack 18 at a predetermined angle as measured from the rack rotational axis 20. A first pivot mechanism 32 is disposed between the rack 18 and the first spindle 22 to allow an operator to vary the predetermined angle. A second pivot mechanism 33 is disposed between the rack 18 and the second spindle 23. The "predetermined" angle may be set at any value between ninety and approximately forty degrees as measured from the rack axis 20. The operator selects the optimum angle, between approximately 40 and 90 degrees, that will most uniformly deposit metal on all surfaces, both recessed and non-recessed, of a given article 26. The value of this optimum angle varies with the configuration of the article to be metallized 26 and the location and configuration of its "hard-to-reach" surfaces.

Variations on the first embodiment may include a pivot mechanism configured to allow the predetermined angle to be adjusted through a full 360 degrees in relation to the rack axis 20. There may also be more than two spindles supporting more than two articles on a single rack within a single vacuum chamber. Preferably, there will be an even number of spindles with equal numbers of spindles projecting in radially-opposite directions in relation to the rack axis 20 to preclude an out-of-balance condition when the rack is rotated.

In practice, a first article 26, such as an automotive wheel, is attached to the first spindle 22 within the vacuum chamber 13. A second article 27, identical to the first article 26, is attached to the second spindle 23. An operator adjusts the pivot mechanisms 32, 33 to move the first 22 and second 23 spindles to a predetermined angle optimized for evenly depositing metal particles on both the recessed and non-recessed surfaces of articles 26, 27. The operator may, alternatively, accomplish this pivot mechanism adjustment step before mounting the articles 26, 27. The operator then closes, seals and evacuates the chamber 13. The articles 26,

27 are then caused to rotate around the rack axis 20 while simultaneously being rotated around their own respective second 24 and third 25 axes. While the articles 26, 27 are being rotated, the electron beam sources 14, 15, 16 emit metal particles toward the articles 26, 27. For each set of articles 26, 27, the metallizing process continues for approximately two minutes. After two minutes, each surface will have been exposed to metal vapor from the emitters 6–8 times.

The second embodiment of the present invention includes a rack having the general shape of a rectangular frame, as shown at 18' in FIG. 3. Connected to the rack 18' is a first mount assembly comprising first 22'a and second 22'b roller-mounts, i.e., a first roller-mount pair. Also connected to the rack 18' is a second mount assembly comprising third 23'a and fourth 23'b roller-mounts, i.e., a second roller-mount pair. The rack 18' has a first side rail 36 that supports the first 22'a and third 23'a roller-mounts, and a second side rail 38 that supports the second 22'b and fourth 23'b roller-mounts.

The roller-mounts 22'a, 22'b, 23'a, 23'b are adapted to hold and rotatably support relatively massive disk or drum-shaped articles 26, 27 such as automotive wheels, that have outer-circumferential surfaces 40. Each roller-mount pair supports one article by bracketing the article, i.e., engaging the article at diametrically opposite points around the outer-circumferential surface 40 of the article.

Each roller-mount 22'a, 22'b, 23'a, 23'b has a roller array 42 disposed in diametrical opposition to the roller array 44 of the other roller-mount in the same roller-mount pair. The roller arrays 42, 44 are adapted to support the article 26, 27 at diametrically opposite points around the outer-circumferential article surface 40. The first 22'a and second 22'b roller-mounts rotatably support a first such article 26 in a position where its outer-circumferential surface 40 is disposed concentrically around the second rotational axis 24'. The second 23'a and third 23'b roller-mounts rotatably support a second such article 27 so that its outer-circumferential surface 40 is disposed concentrically around the third rotational axis 25'.

Each roller array 42, 44 includes a first 46 and a second 48 group of rollers. The first group of rollers 46 in each array 42, 44 is coaxially arranged along a common rotational axis. The second group of rollers 48 in each array 42, 44 is coaxially arranged along a second common rotational axis that lies parallel to and is spaced from the axis common to the first group of rollers. Each roller-mount 22'a, 22'b, 23'a, 23'b supports its two roller groups 46, 48 so that their respective common axes lie parallel to each other, are spaced-apart from each other, and lie parallel to the rotational axis 24', 25' of the article 26, 27. The roller groups 46, 48 in each roller-mount are positioned with their common axes spaced apart so that the roller groups 46, 48 of each roller mount will contact a mounted article 26, 27 at circumferentially-spaced points around the outer-circumferential surface 40 of the article 26, 27. Because the two roller groups 46, 48 in each roller-mount contact the mounted article at circumferentially-spaced points, they prevent the mounted articles 26, 27 from rolling out of the "grip" of each roller-mount pair.

One roller array 42 in each roller-mount pair includes at least one driven roller 50 or driven roller group adapted to impart rotational motion to the article 26, 27 that the roller-mount pair supports. To provide rotational motion to each driven roller 50, a pair of fixed gears 52 are concentrically disposed around the rack axis 20' adjacent each rack end. The fixed gears 52 are each supported in a fixed relationship relative to the chamber 13. Each of a pair of wheel drive gears 54 are supported on the rack adjacent one of the fixed gears 52. Each wheel drive gear 54 engages and receives relative rotational motion from one of the fixed gears 52 as the rack 18' rotates around the rack axis 20' and the fixed gears 52 remain stationary. Each of a pair of flexible drive shafts 56 receives rotational motion from one of the drive gears 54. Each flexible drive shaft 56 transmits the rotational motion to one of the roller-mount drive rollers 50. In other words, the first 22'a and third 23'a roller-mount drive rollers 50 receive rotational motion from flexible drive shafts 56 which, in turn, receive rotational motion from wheel drive gears 54 that turn in contact with fixed gears 52 whenever the rack is rotating around the rack axis 20'.

An operator-adjustable pivot mechanism 32'a, 32'b, 33'a, 33'b is disposed between each roller-mount 22'a, 22'b, 23'a, 23'b and the rack 18'. The operator controls the angle of each mounted article 26, 27 by adjusting the position of the two roller mounts that support the article. The operator adjusts the position of the roller mounts by adjusting the pivot mechanisms that pivotally support the roller mounts. In adjusting the pivot mechanisms, the operator selects the optimum article angle that will most uniformly deposit metal on all article surfaces, both recessed and non-recessed. The operator may select any angle between 0 and 360 degrees. The value of this optimum angle varies with the configuration of the article to be metallized 26, 27 and the location and configuration of its "hard-to-reach" surfaces.

Variants of the second embodiment may include more than two mount assemblies to support more than two articles on a single rack within a single vacuum chamber. The additional articles may be separately driven, or may all be driven off of either one or two drive gears by a series of interconnecting flexible drive shafts extending between adjacent roller-mounts.

Variations on the second embodiment may also include mount assemblies that support each article in positions where the article centers-of-gravity are not located along the rack axis. For metalizing apparatuses that include mount assemblies of this type, it is preferable that they also include an even number of mount assemblies so that equal numbers of the article centers-of-gravity may be offset in radially-opposite directions from the rack axis 20 to preclude an out-of-balance condition when the rack is rotated.

In practice, a vacuum metalizer constructed according to the second embodiment of the invention is used in the same manner as a metalizer constructed according to the first embodiment with the exception that the operator must mount each article 26, 27 between a pair of roller mounts 22'a, 22'b; 23'a, 23'b rather than placing each article over a spindle 22, 23.

Because, in both the first and second embodiments, each article 26, 27 is rotated about two different axes, recessed and non-recessed surfaces of each article are exposed to metal vapor from many different angles and at frequent intervals. This results in an even distribution of metal across the surfaces of relatively massive articles such as automotive wheels.

Because the present invention allows an operator to vary the angles between the rotational axes, relatively large articles of many different configurations may be positioned to allow greater metal particle access to the hard-to-reach recessed surfaces of the articles.

Because the present invention includes a relatively large vacuum chamber and a pair of braces that rotationally support the rack, articles of considerable size and mass can be easily supported for rotation on the rack between the braces and vacuum metallized with even deposition over recessed and non-recessed surfaces.

This is an illustrative description of the invention using words of description rather than of limitation. One may practice the invention other than as described.

I claim:

1. A metallizing apparatus for vacuum-metallizing both recessed and non-recessed surfaces of a relatively massive article such as an automotive wheel, said apparatus comprising:

a vacuum chamber;

a first metal particle emitter supported in said chamber to direct metal particles toward a first article;

a rack having a rotational rack axis, said rack supported for rotation within said chamber about said rack axis adjacent said first emitter;

a first mount assembly supported on said rack and adapted to removably support the first article for rotation about a second axis, said second axis extending at a first predetermined angle to said rack axis to cause the first article to simultaneously rotate about said rack axis and said second axis thereby exposing the hard-to-reach recessed article surfaces to metal particle emissions from said first emitter and allowing said first emitter to deposit said metal particles more evenly across the recessed and non-recessed article surfaces.

2. A metallizing apparatus as defined in claim 1 including a first pivot mechanism disposed between said rack and said first mount assembly, said first pivot mechanism adapted to vary said first predetermined angle.

3. A metallizing apparatus as defined in claim 2 said first pivot mechanism being adapted to allow said first predetermined angle to be adjusted through an angular range of up to 360 degrees.

4. A metallizing apparatus as defined in claim 2 said first pivot mechanism being adapted to allow said first predetermined angle to be adjusted through an approximate range of 40 to 90 degrees.

5. A metallizing apparatus as defined in claim 1 wherein said first mount assembly and said rack are adapted to removably and rotatably support the first article in a position where said second axis passes through the center of gravity of the first article.

6. A metallizing apparatus as defined in claim 1 wherein said first mount assembly and said rack are adapted to removably and rotatably support the first article in a position where said rack axis passes through the center of gravity of the first article.

7. A metallizing apparatus as defined in claim 1 including a second mount assembly connected to said rack and adapted to removably support a second article for rotation about a third axis, said third axis extending at a second predetermined angle to said rack axis.

8. A metallizing apparatus as defined in claim 7 including a second pivot mechanism disposed between said rack and said second mount assembly, said second pivot mechanism adapted to vary said second predetermined angle.

9. A metallizing apparatus as defined in claim 1 wherein said rack has first and second rack ends and where said apparatus includes first and second end braces fixed to said chamber and supporting said rack adjacent said respective first and second rack ends for rotation about said rack axis.

10. A metallizing apparatus as defined in claim 1 wherein apparatus includes a second emitter and where said first and second emitters are mounted in a linear array and where said linear array is supported within said chamber and disposed parallel to said rack axis.

11. A metallizing apparatus as defined in claim 7 wherein said first and second mount assemblies comprise respective first and second spindles rotatably mounted to said rack and extending from said rack in radially-opposite directions along said respective second and third axes, said spindles adapted to removably and rotatably support the respective first and second articles about said respective second and third axes.

12. A metallizing apparatus as defined in claim 1 wherein said rack includes first and second rack sides and where said first article includes an outer circumferential surface disposed concentrically around said second rotational axis and where said first mount assembly comprises first and second roller-mounts connected to said respective first and second rack sides, said first and second roller-mounts having roller arrays disposed in diametrical opposition to one another and adapted to support the first article at diametrically opposite points around said outer circumferential surface, said roller arrays including at least one driven roller adapted to impart rotational motion to said first article.

13. A metallizing apparatus as defined in claim 1 including:

a fixed gear concentrically disposed around said rack axis adjacent said rack end, said fixed gear supported in a fixed relationship relative to said chamber;

a wheel drive gear supported on said rack end adjacent said fixed gear, said wheel drive gear engaging and receiving relative rotational motion from said fixed gear as said rack rotates around said rack axis and said fixed gear remains stationary;

a flexible drive shaft having a first shaft end coupled to said wheel drive gear, said first shaft end adapted to receive rotational motion from said drive gear, and a second shaft end coupled to said roller-mount drive roller, said second shaft end adapted to transmit rotational motion to said roller-mount drive roller.

14. A method of vacuum-metallizing both recessed and non-recessed surfaces of a relatively massive article such as an automotive wheel, the method comprising the steps of:

providing a metallizing apparatus comprising a vacuum chamber, a metal particle emitter supported in the chamber, a rack having a rotational rack axis, said rack supported for rotation within the chamber about said rack axis and adjacent the emitter, a first mount assembly adapted to removably hold and rotatably support a first article about a second rotational axis, said second rotational axis extending at a first predetermined angle to the rack axis;

mounting a first article on the first mount assembly;

evacuating the chamber;

emitting metal particles toward the first article from the emitter;

rotating the first article around the rack axis; and simultaneously rotating the first article around the second rotational axis.

15. A method as defined in claim 14 including the steps of:

providing a first pivot mechanism disposed between the rack and the first mount assembly prior to said step of mounting the first article; and adjusting the pivot mechanism to move the first mount assembly to a predetermined angle optimized for evenly depositing metal particles on both the recessed and non-recessed surfaces of an article of a particular configuration, prior to said step of emitting metal particles.

16. A method as defined in claim 15 wherein said step of providing a metalizing apparatus includes the provision of:

a second mount assembly supported on the rack and adapted to removably fasten a second article to the rack, the second mount assembly adapted to support the second article for rotation about a third axis extending at a predetermined angle from the rack axis, the second mount assembly extending in a direction away from the rack axis that is radially opposite and parallel to the direction the first mount assembly extends away from the rack axis; and a second pivot mechanism disposed between the rack and the second mount assembly;

and where said method includes the additional steps of:

mounting the second article on the second mount assembly prior to said step of evacuating the chamber;

emitting metal particles toward the second article after said step of evacuating the chamber; and simultaneously rotating the second article around the rack axis and the third rotational axis.

17. A method as defined in claim 16 including the step of adjusting each pivot mechanism to move its respective mount assembly until its associated rotational axis is disposed at a predetermined angle with the rack axis prior to said step of evacuating the chamber.

* * * * *